(12) United States Patent
Kyoung

(10) Patent No.: US 10,424,758 B2
(45) Date of Patent: Sep. 24, 2019

(54) METHOD OF MANUFACTURING ENCAPSULATION FILM AND ORGANIC LIGHT EMITTING DISPLAY DEVICE USING PHOTO- OR THERMAL-CURABLE ADHESIVE

(71) Applicant: LG Display Co., Ltd., Seoul (KR)

(72) Inventor: Se Ung Kyoung, Gimje-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 15/801,621

(22) Filed: Nov. 2, 2017

(65) Prior Publication Data

US 2018/0145276 A1 May 24, 2018

Related U.S. Application Data

(62) Division of application No. 14/829,148, filed on Aug. 18, 2015, now abandoned.

(30) Foreign Application Priority Data

Oct. 29, 2014 (KR) .................. 10-2014-0148590

(51) Int. Cl.
*H01L 51/52* (2006.01)
*B32B 37/00* (2006.01)
(Continued)

(52) U.S. Cl.
CPC ............ *H01L 51/5246* (2013.01); *B32B 3/04* (2013.01); *B32B 3/18* (2013.01); *B32B 5/142* (2013.01); *B32B 7/12* (2013.01); *B32B 15/06* (2013.01); *B32B 25/08* (2013.01); *B32B 27/08* (2013.01); *B32B 27/281* (2013.01); *B32B 27/283* (2013.01); *B32B 27/30* (2013.01); *B32B 27/304* (2013.01); *B32B 27/306* (2013.01);
(Continued)

(58) Field of Classification Search
CPC .... H01L 51/5246; H01L 51/525; B32B 15/08
See application file for complete search history.

(56) References Cited

U.S. PATENT DOCUMENTS

2003/0218422 A1  11/2003  Park et al.
2004/0245541 A1  12/2004  Shitagaki ............... H05B 33/04
                                            257/103

(Continued)

FOREIGN PATENT DOCUMENTS

CN    104093805 A    10/2014
JP    2004-303528 A  10/2004
(Continued)

OTHER PUBLICATIONS

Definition of dispose of. (n.d.) American Heritage® Dictionary of the English Language, Fifth Edition. (2011). Retrieved May 25, 2017 from http://www.thefreedictionary.com/dispose+of.

*Primary Examiner* — Michael Jung
(74) *Attorney, Agent, or Firm* — Dentons US LLP

(57) ABSTRACT

Disclosed is an organic light emitting display apparatus. An outer portion of an adhesive layer is set higher in degree of cure than a center portion of the adhesive layer, and thus, a driving defect is prevented from occurring because the adhesive layer stretches in a manufacturing process, and various defects are prevented from being caused by a jig, thereby enhancing reliability and productivity of the organic light emitting display apparatus.

17 Claims, 6 Drawing Sheets

(51) Int. Cl.
- *B32B 38/00* (2006.01)
- *B32B 5/14* (2006.01)
- *B32B 7/12* (2006.01)
- *B32B 15/06* (2006.01)
- *B32B 25/08* (2006.01)
- *B32B 27/08* (2006.01)
- *B32B 27/28* (2006.01)
- *B32B 27/30* (2006.01)
- *B32B 27/32* (2006.01)
- *B32B 27/36* (2006.01)
- *B32B 27/38* (2006.01)
- *B32B 27/40* (2006.01)
- *B32B 27/42* (2006.01)
- *B32B 3/04* (2006.01)
- *B32B 3/18* (2006.01)
- *C09J 7/29* (2018.01)
- *C09J 7/22* (2018.01)
- *C09J 7/30* (2018.01)
- *B32B 15/08* (2006.01)
- *B32B 37/12* (2006.01)

(52) U.S. Cl.
CPC ............ *B32B 27/308* (2013.01); *B32B 27/32* (2013.01); *B32B 27/36* (2013.01); *B32B 27/38* (2013.01); *B32B 27/40* (2013.01); *B32B 27/42* (2013.01); *B32B 37/0076* (2013.01); *B32B 38/0004* (2013.01); *C09J 7/22* (2018.01); *C09J 7/29* (2018.01); *C09J 7/30* (2018.01); *H01L 51/525* (2013.01); *H01L 51/5243* (2013.01); *B32B 15/08* (2013.01); *B32B 2037/1253* (2013.01); *B32B 2038/0076* (2013.01); *B32B 2307/7244* (2013.01); *B32B 2307/7246* (2013.01); *B32B 2307/7265* (2013.01); *B32B 2310/0843* (2013.01); *B32B 2311/00* (2013.01); *B32B 2457/206* (2013.01); *C09J 2201/40* (2013.01); *C09J 2400/163* (2013.01); *H01L 2251/566* (2013.01)

(56) References Cited

U.S. PATENT DOCUMENTS

| | | | |
|---|---|---|---|
| 2006/0135029 A1 | 6/2006 | Harada | H01L 51/5253 445/25 |
| 2007/0013292 A1 | 1/2007 | Inoue | H05B 33/04 313/504 |
| 2014/0077201 A1 | 3/2014 | Becker et al. | |
| 2014/0332782 A1* | 11/2014 | Yoo | C09J 7/10 257/40 |
| 2015/0009646 A1 | 1/2015 | Han | G02F 1/1339 361/784 |
| 2015/0194636 A1 | 7/2015 | Okumura | |
| 2015/0355498 A1 | 12/2015 | Yoshida | G02F 1/133308 349/110 |
| 2016/0020056 A1* | 1/2016 | Kim | H01J 9/261 445/25 |
| 2016/0254485 A1 | 9/2016 | Song | H01L 51/56 257/40 |
| 2016/0329519 A1 | 11/2016 | Yu | H01L 51/52 |

FOREIGN PATENT DOCUMENTS

| | | | |
|---|---|---|---|
| WO | WO-2013115627 A1 * | 8/2013 | ............ C09J 7/00 |
| WO | 2014/024479 A1 | 2/2014 | |

* cited by examiner

METHOD OF MANUFACTURING ENCAPSULATION FILM AND ORGANIC LIGHT EMITTING DISPLAY DEVICE USING PHOTO- OR THERMAL-CURABLE ADHESIVE

CROSS-REFERENCE TO RELATED APPLICATIONS

This application is a Divisional of U.S. patent application Ser. No. 14/829,148 filed on Aug. 18, 2015, which claims the benefit of Korean Patent Application No. 10-2014-0148590 filed on Oct. 29, 2014, the disclosures of which are which is hereby incorporated by reference for all purposes as if fully set forth herein.

BACKGROUND

Field of the Invention

The present invention relates to an encapsulation film for organic light emitting display apparatuses, a method of manufacturing the same, and an organic light emitting display apparatus using the same. More particularly, the present invention relates to an encapsulation film for organic light emitting display apparatuses, a method of manufacturing the same, and an organic light emitting display apparatus using the same, in which degrees of cure of an outer portion and a center portion of an adhesive layer are differently set. Thus, reliability and productivity of the organic light emitting display apparatus are enhanced.

Discussion of the Related Art

Organic light emitting display apparatuses, which self-emitting display apparatuses, are display apparatuses using the principle that an organic emission layer is disposed between two electrodes, an electron and a hole are injected from the two electrodes into the organic emission layer, and light is emitted by a combination of the injected electron and hole. Since the organic light emitting display apparatuses do not use a separate light source, unlike liquid crystal display (LCD) apparatuses, the organic light emitting display apparatus may be manufactured to be light and thin. Also, the organic light emitting display apparatuses have low power consumption because of a low driving voltage and are good in response time and viewing angle. Thus, they are being researched as next-generation display apparatuses.

The organic light emitting display apparatuses are categorized into a top emission type, a bottom emission type, and a dual emission type depending on a direction where light is emitted. Also, the organic light emitting display apparatuses are categorized into an active matrix type and a passive matrix type depending on a driving mode.

SUMMARY

Organic light emitting display apparatus are vulnerable to water ($H_2O$) or oxygen ($O_2$). To provide a detailed description, when water or oxygen penetrates into an organic light emitting device which includes an anode, an organic emission layer, and a cathode, a metal electrode is oxidized, or the organic emission layer is deteriorated, causing problems of a reduction in lifetime and various defects such as a dark spot, pixel shrinkage, and/or the like.

In order to solve such problems, a side encapsulation method using a shield cap formed of metal or glass, or a front encapsulation method where an adhesive layer is coated all over an organic light emitting device is being used. Particularly, the front encapsulation method which enables a thickness of an organic light emitting display apparatus to be thinned and may be applied to flexible organic light emitting display apparatuses is being much researched recently.

When the front encapsulation method is applied to a bottom emission type organic light emitting display apparatus, an upper substrate may use a metal layer. Generally, organic light emitting display apparatuses each include a lower substrate, on which an organic light emitting device is disposed, and an upper substrate disposed on the organic light emitting device. In the bottom emission type organic light emitting display apparatus, since light is emitted in a direction toward the lower substrate, the upper substrate may use an opaque metal layer.

When the upper substrate of the organic light emitting display apparatus uses a metal layer, lightening and thinning are more easily made than a structure using a glass substrate, and thus, a weight and a thickness of the organic light emitting display apparatus are reduced. Therefore, a structure which enables a thin metal layer to be applied to the organic light emitting display apparatus is being continuously researched.

A bottom emission type organic light emitting display apparatus using the front encapsulation method may be manufactured by bonding a substrate, on which an organic light emitting device is disposed, to a metal layer with an adhesive layer adhered thereto. The adhesive layer is disposed between the substrate and the metal layer and fixes the substrate to the metal layer in a face seal method. The adhesive layer seals the organic light emitting device to protect the organic light emitting device against the penetration of external water or oxygen.

The adhesive layer is formed of a curing resin which is low in viscosity, namely, is good in flowability, and for this reason, the adhesive layer stretches due to heat and pressure in a process of bonding the substrate to the metal layer. Since the flowability of the adhesive layer enables a step height of the substrate including the organic light emitting device to be covered, the flowability is an important factor for sealing the organic light emitting device, but since the adhesive layer more stretches or expands than a design value in a process of sealing an outer portion of the adhesive layer, it is difficult to accurately seal the adhesive layer.

When the adhesive layer excessively stretches above the design value, a contact defect occurs between an external circuit unit and a pad which is disposed at an outer portion of the substrate. To provide a detailed description on this, the pad electrically connected to the organic light emitting device is disposed at the outer portion of the substrate and is connected to the external circuit unit (for example, a flexible printed circuit board with a driver integrated circuit (IC) mounted thereon) that supplies various signals to the organic light emitting device. In the above-described bonding process, when the adhesive layer stretches to the pad disposed at the outer portion of the substrate due to heat and pressure, the external circuit unit is not sufficiently adhered to the pad. For this reason, a contact defect occurs between the pad and the external circuit unit, and consequently, a driving defect of the organic light emitting device increases, causing a reduction in reliability and productivity of the organic light emitting display apparatus.

To provide a more detailed description of the bonding process of bonding the substrate to the metal layer, the metal layer adhered to the adhesive layer is first fixed to a jig having a plate shape, and a process of bonding the metal layer to the substrate including the organic light emitting device is performed. When the bonding process is completed, the jig is detached from the metal layer. In this case, when the adhesive layer stretches to the jig through the metal layer, a portion of the adhesive layer clings to the jig. The portion of the adhesive layer clinging to the jig is not easily removed in a general cleaning process.

The jig is reused in a manufacturing process, and a plurality of metal layers having various sizes are repeatedly fixed to and detached from the jig. In such a process, a portion of the adhesive layer clinging to the jig moves and clings to another metal layer, or the adhesive layer hinders the jig from being detached from the other metal layer. When a portion of the adhesive layer clings to another metal layer, a surface of the metal layer is damaged by a foreign material, causing a reduction in reliability of the organic light emitting display apparatus. Also, the jig cannot be detached from the metal layer, and for this reason, the metal layer itself is damaged in a manufacturing process. Furthermore, when the jig is used to fix a panel or the like in addition to fixing the metal layer, a portion of the adhesive layer clings to a glass substrate of the panel, causing a defective screen of the panel.

In order to solve such a problem, it may be considered to increase a design value of an area where the adhesive layer stretches. However, such a method causes an increase in a bezel corresponding to a non-display area of the organic light emitting display apparatus, and for this reason, it is difficult to implement a narrow bezel, a zero bezel, or bezel free.

Therefore, the inventors of the present invention have recognized the above-described problems, and by researching on a structure and method for controlling a flowability of an outer portion of the adhesive layer, the inventors have invented an encapsulation film, having a new structure, for organic light emitting display apparatuses, a method of manufacturing the same, and an organic light emitting display apparatus using the same, in which reliability and productivity of the organic light emitting display apparatus are enhanced.

Accordingly, the present invention is directed to provide an encapsulation film for organic light emitting display apparatuses, a method of manufacturing the same, and an organic light emitting display apparatus using the same that substantially obviate one or more problems due to limitations and disadvantages of the related art.

An aspect of the present invention is directed to provide an encapsulation film for organic light emitting display apparatuses and a method of manufacturing the same, in which viscosities of an outer portion and a center portion of an adhesive layer are differently set, and thus, a driving defect is prevented from occurring in a process of manufacturing the organic light emitting display apparatus, and a water blocking function of the adhesive layer is prevented from being deteriorated due to water or oxygen which penetrates into the adhesive layer for a process standby time.

Another aspect of the present invention is directed to provide an organic light emitting display apparatus in which an outer portion of an adhesive layer is set higher in degree of cure than a center portion of the adhesive layer, and thus, a driving defect is prevented from occurring because the adhesive layer stretches in a manufacturing process, and various defects are prevented from being caused by a jig, thereby enhancing reliability and productivity of the organic light emitting display apparatus.

Another aspect of the present invention is directed to provide a method of manufacturing an encapsulation film for organic light emitting display apparatuses, which simplifies a manufacturing process and shortens a process tack time by simultaneously performing a process of removing a portion of an adhesive layer and a process of increasing a viscosity of a portion of the adhesive layer, thereby contributing to enhance productivity.

The aspects of the present invention are not limited to the aforesaid, but other aspects not described herein will be clearly understood by those skilled in the art from descriptions below.

Additional advantages and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these and other advantages and in accordance with the purpose of the invention, as embodied and broadly described herein, there is provided an encapsulation film for an organic light emitting display apparatus including an adhesive layer that is disposed between a metal layer and a protective layer and includes a first portion and a second portion. In the encapsulation film for the organic light emitting display apparatus, a viscosity of the second portion of the adhesive layer is higher than a viscosity of the first portion of the adhesive layer. Accordingly, a driving defect that occurs in a process of manufacturing an organic light emitting display apparatus and an incidence of deterioration of a water blocking function of the adhesive layer are effectively reduced.

In another aspect of the present invention, there is provided a structure including a first film having metal properties and a second film having adhesive properties. The second film having adhesive properties is adhered to one surface of the first film having metal properties. The second film includes an area having relatively lower viscosity and another area that has relatively high viscosity and surrounds an outer portion of the area having relatively lower viscosity, and the second film enables roll-to-roll processing to be performed. The first film and the second film are provided as one body to function as an encapsulation part for organic light emitting display apparatuses. Accordingly, a process of manufacturing an organic light emitting display apparatus is simplified, and the manufacturing cost is effectively reduced.

In another aspect of the present invention, there is provided an organic light emitting display apparatus including an organic light emitting device on a substrate, an adhesive layer configured to seal the organic light emitting device, and a metal layer on the adhesive layer. The adhesive layer includes a first portion and a second portion. A degree of cure of the second portion is higher than a degree of cure of the first portion. Since an outer portion of an adhesive layer is set higher in degree of cure than a center portion of the adhesive layer, and thus, a driving defect is prevented from occurring because the adhesive layer stretches in a manufacturing process, and various defects are prevented from being caused by a jig, thereby enhancing reliability and productivity of the organic light emitting display apparatus.

In another aspect of the present invention, there is provided a method of manufacturing an encapsulation film for organic light emitting display apparatuses including laminating a base metal layer and a base adhesive layer, forming an adhesive layer including a first portion, and a second portion that is higher in viscosity than the first portion by removing a cut portion of the base adhesive layer with a first laser, and forming a metal layer by removing a cut portion of the base metal layer with a second laser. In the method of manufacturing an encapsulation film for organic light emitting display apparatuses according to an embodiment of the present invention, the second portion is formed simultaneously with removing the cut portion of the base adhesive layer, and thus, a manufacturing process is simplified, and productivity is effectively enhanced.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiments of the invention and together with the description serve to explain the principle of the invention. In the drawings.

DETAILED DESCRIPTION OF THE INVENTION

Figure 1A:
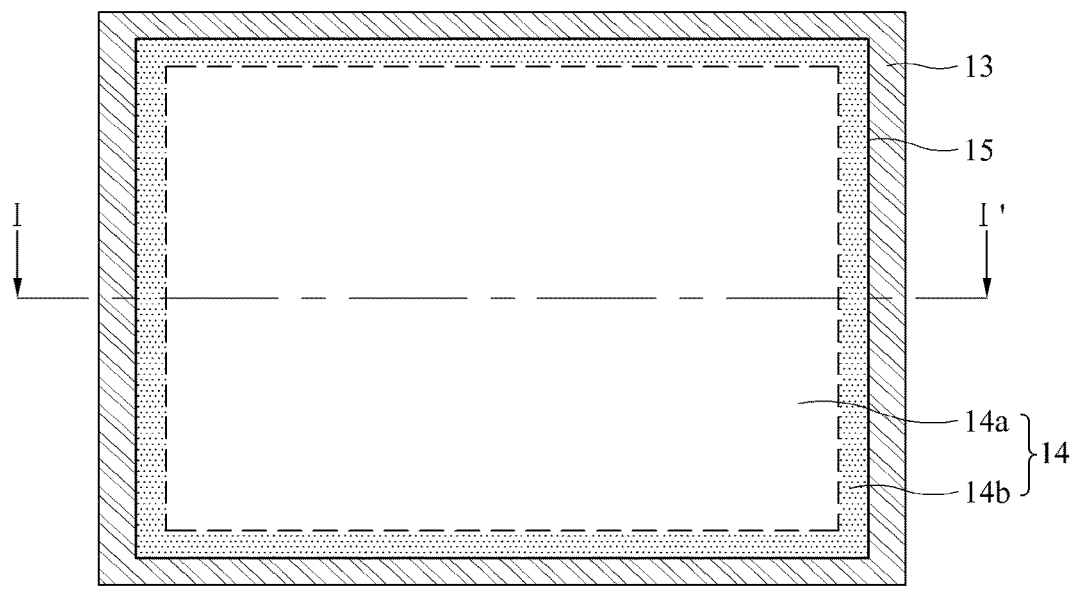
FIG. 1A is a plan view illustrating an encapsulation film for organic light emitting display apparatuses, according to an embodiment of the present invention.

Reference will now be made in detail to the exemplary embodiments of the present invention, examples of which are illustrated in the accompanying drawings. Wherever possible, the same reference numbers will be used throughout the drawings to refer to the same or like parts.

Advantages and features of the present invention, and implementation methods thereof will be clarified through following embodiments described with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Furthermore, the present invention is only defined by scopes of claims.

A shape, a size, a ratio, an angle, and a number disclosed in the drawings for describing embodiments of the present invention are merely an example, and thus, the present invention is not limited to the illustrated details. Like reference numerals refer to like elements throughout. In the following description, when the detailed description of the relevant known function or configuration is determined to unnecessarily obscure the important point of the present invention, the detailed description will be omitted.

In a case where 'comprise', 'have', and 'include' described in the present specification are used, another part may be added unless 'only~' is used. The terms of a singular form may include plural forms unless referred to the contrary.

In construing an element, the element is construed as including an error range although there is no explicit description.

In describing a position relationship, for example, when a position relation between two parts is described as 'on~', 'over~', 'under~', and 'next~', one or more other parts may be disposed between the two parts unless 'just' or 'direct' is used.

In describing a time relationship, for example, when the temporal order is described as 'after~', 'subsequent~', 'next~', and 'before~', a case which is not continuous may be included unless 'just' or 'direct' is used.

It will be understood that, although the terms "first", "second", etc. may be used herein to describe various elements, these elements should not be limited by these terms. These terms are only used to distinguish one element from another. For example, a first element could be termed a second element, and, similarly, a second element could be termed a first element, without departing from the scope of the present invention.

A thickness and a size of each element in the drawings are illustrated in the drawings for convenience of a description, and the present invention is not limited to the thickness and size of each element illustrated in the drawings.

Features of various embodiments of the present invention may be partially or overall coupled to or combined with each other, and may be variously inter-operated with each other and driven technically as those skilled in the art can sufficiently understand. The embodiments of the present invention may be carried out independently from each other, or may be carried out together in co-dependent relationship.

Hereinafter, an encapsulation film for organic light emitting display apparatuses according to an embodiment of the present invention will be described in detail with reference to the accompanying drawings.

Figure 1B:
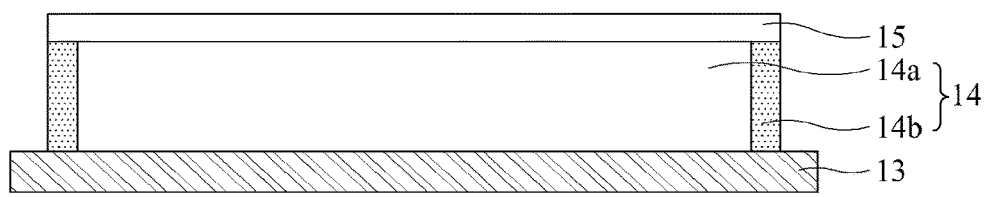
FIG. 1B is a cross-sectional view taken along line I-I' of FIG. 1A.

FIG. 1A is a plan view illustrating an encapsulation film 10 for organic light emitting display apparatuses, according to an embodiment of the present invention, and FIG. 1B is a cross-sectional view taken along line I-I' of FIG. 1A.

Referring to FIGS. 1A and 1B, the encapsulation film 10 may include a metal layer 13, an adhesive layer 14, and a protective layer 15.

The adhesive layer 14 may be disposed between the metal layer 13 and the protective layer 15 and may include a first portion 14a and a second portion 14b. The first portion 14a may be referred to as a first area, and the second portion 14b may be referred to as a second area.

The adhesive layer 14 may be formed of a photocurable resin, a thermocurable resin, or the like, and for example, may be formed of at least one of epoxy, phenol, amino, rubber, unsaturated polyester, silicone, acryl, vinyl, olefin, polyimide, and/or the like.

Resins available for the adhesive layer 14 may have benefits and disadvantages. Therefore, a resin applied to the adhesive layer 14 may be selected by taking into account electrical, mechanical, and chemical characteristics and may also be selected by further taking into account performance and cost.

Referring FIG. 1A, the second portion 14b of the adhesive layer 14 may surround the first portion 14a. That is, the second portion 14b may correspond to an outer portion of the adhesive layer 14, and the first portion 14a may correspond to a center portion of the adhesive layer 14.

A viscosity of the first portion 14a and a viscosity of the second portion 14b of the adhesive layer 14 may be differently set. In more detail, the viscosity of the second portion 14b of the adhesive layer 14 may be set higher than that of the first portion 14a. The viscosity of the second portion 14b being high set may be effective for controlling a flowability of the adhesive layer 14. When the encapsulation film 10 is applied to an organic light emitting display apparatus, the second portion 14b of the adhesive layer 14 may control the adhesive layer so as not to excessively stretch.

The second portion 14b of the adhesive layer 14 may be higher in degree of cure "D" than the first portion 14a. In more detail, the first portion 14a may be in a non-cured state where a resin is not yet cured, namely, the resin does not undergo a curing process, and may be low in viscosity. The second portion 14b may be in a cured state where a resin has undergone the curing process and may be high in viscosity.

Here, the degree of cure "D" may be defined as the following Equation (1):

$$D[\%] = \frac{H1 - H2}{H1} \times 100 \quad (1)$$

where H1 denotes heat that is generated while a sample in a non-cured state is completely cured, and H2 denotes heat that is generated while a sample to be measured is completely cured. For example, a sample 1 may be formed of a material "A" and may be in a non-cured state where the curing process is not yet performed, and a sample 2 may be formed of the material "A" and may be in a state where the curing process has been performed for a certain time. In this case, a degree of cure of the sample 1 is as follows. When it is assume that the heat "H1" which is generated while the sample 1 is completely cured is 100 and the heat "H2" which is generated while the sample 2 cured to a certain degree is completely cured again is 40, a degree of cure of the sample 2 may be "60%((100−40)/100*100)". That is, as a sample is more cured, the degree of cure "D" may be measured to have a higher value.

As described above, since the second portion 14b of the adhesive layer 14 is in a cured state where the curing process has been performed, the degree of cure "D" of the second portion 14b may be higher than that of the first portion 14a. Also, reaction energy of the first portion 14a may be higher than that of the second portion 14b. Since the first portion 14 is hardly cured, the first portion 14a may include residual reaction energy to be cured later. However, since the second portion 14b is almost cured, the second portion 14b may hardly include residual reaction energy to be cured later. The heat "H1" or "H2" or residual reaction energy for calculating the degree of cure "D" may have a value that is obtained by measuring the first portion 14a and second portion 14b of the adhesive layer 14 in differential scanning calorimetry (DSC).

The first portion 14a may be in a non-cured state or may be very slowly cured even for a standby time. Therefore, a degree of cure "D" of the first portion 14a may be about 0.1% to about 15% depending on a place where the encapsulation film 10 is kept and a time for which the encapsulation film 10 is kept.

The second portion 14b may be in a cured state, and a degree of cure "D" of the second portion 14b may be about 95% to about 100%. In other words, the degree of cure of the second portion 14b may be equal to or greater than 95% and equal to or less than 100%. The second portion 14b may be in a completely cured state, where the degree of cure "D" is 100%, depending on a curing method and a manufacturing process. A more detailed method of manufacturing the encapsulation film 10 may be described below in detail with reference to FIGS. 3 to 7.

The second portion 14b of the adhesive layer 14 may be in a cured state and may completely surround the first portion 14a. Therefore, external water or oxygen which penetrates into the adhesive layer 14 for a process standby time in a process of manufacturing an organic light emitting display apparatus is reduced. In detail, a side surface of the adhesive layer 14 may be exposed to the atmosphere as-is, and thus, the adhesive layer 14 is much affected by the penetration of water or oxygen. If the second portion 14b corresponding to the side surface and an outer portion of the adhesive layer 14 is previously cured, a bonding force between particles of the side surface is strengthened. Therefore, it is difficult for water or oxygen to penetrate through the side surface and outer portion of the adhesive layer 14, and thus, water penetration speed is lowered. Accordingly, when the second portion 14b of the adhesive layer 14 is in a cured state and completely surrounds the first portion 14a, an incidence of a reduction in a water blocking function of the adhesive layer 14 is minimized.

When the encapsulation film 10 is applied to the organic light emitting display apparatus, the metal layer 13 may act as a substrate of the organic light emitting display apparatus. In this case, each of the adhesive layer 14 and the metal layer 13 may function as an encapsulation part of the organic light emitting display apparatus. The metal layer 13 may be formed of one of iron (Fe), nickel (Ni), aluminum (Al), copper (Cu), tungsten (W), and/or the like, or may be formed by a combination thereof. A thickness of the metal layer 13 may be about 1 μm to about 1,000 μm. Referring to FIGS. 1A and 1B, an area of the metal layer 13 may be broader than that of the adhesive layer 14. In other words, a surface size of the metal layer 13 may have a larger value than that of the adhesive layer 14. When an area of the metal layer 13 is broader than that of the adhesive layer 14, the adhesive layer 14 is more effectively supported and protected. The metal layer 13 may be used as a margin area for a case where the adhesive layer 14 stretches due to pressure caused by bonding.

The protective layer 15 may support and protect the adhesive layer 14 until the encapsulation film 10 is applied to the organic light emitting display apparatus. The protective layer 15 may be formed of a polymer material, and for example, may be one of a polyethylene film, a lypropylene film, a polybutene film, a polybutadiene film, a vinyl chloride copolymer film, a polyurethane film, an ethylene-vinyl acetate film, an ethylene-propylene copolymer film, a polyimide film, and/or the like.

As described above, in the encapsulation film 10 of the organic light emitting display apparatus according to an embodiment of the present invention, since the second portion 14b corresponding to the outer portion of the adhesive layer 14 is higher in viscosity than the first portion 14a corresponding to the center portion of the adhesive layer 14, it is easy to control a flowability of the adhesive layer 14, and the water blocking function of the adhesive layer 14 is prevented from being deteriorated due to water or oxygen which penetrates into the inside through the side surface of the adhesive layer 14.

Figure 2A:
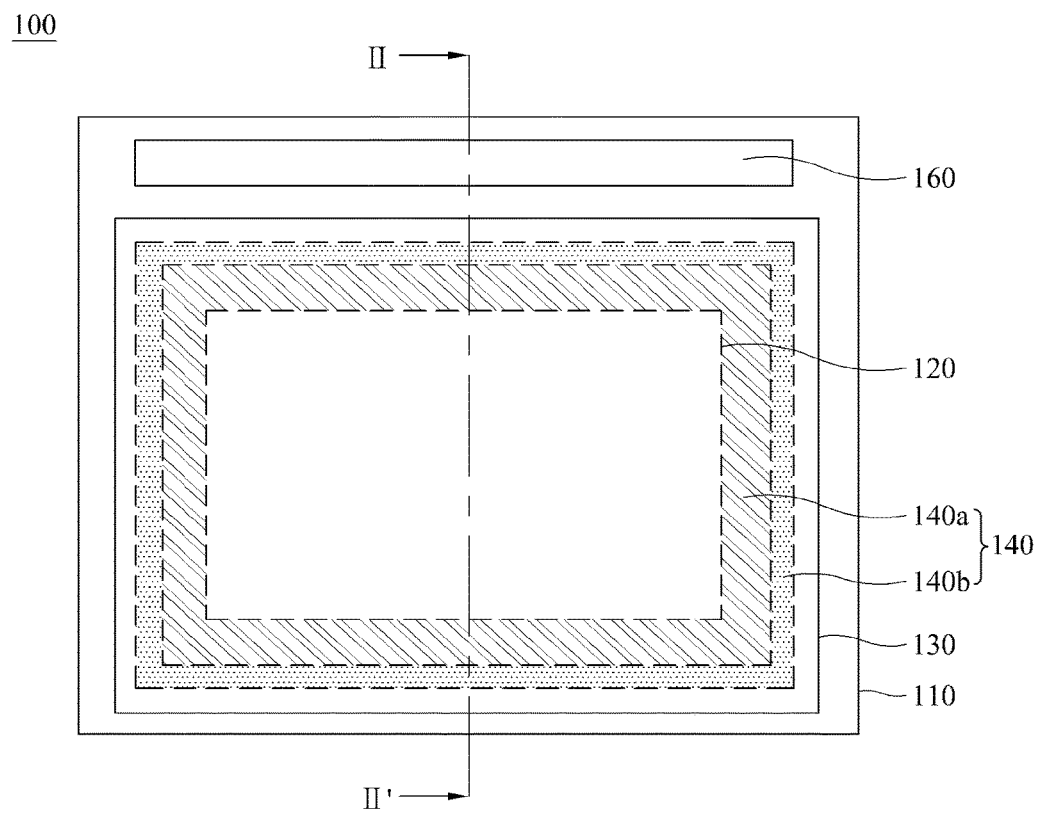
FIG. 2A is a plan view illustrating an encapsulation film for organic light emitting display apparatuses, according to another embodiment of the present invention.
Figure 2B:
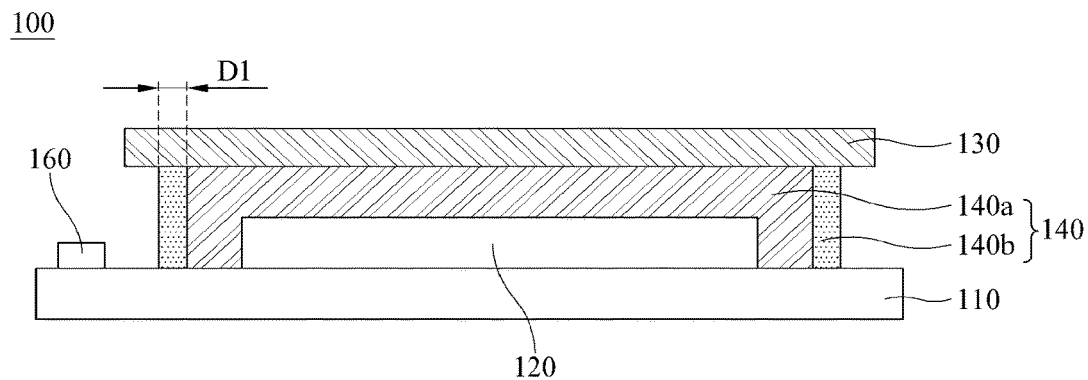
FIG. 2B is a cross-sectional view taken along line II-II' of FIG. 2A.

FIG. 2A is a plan view illustrating an encapsulation film for organic light emitting display apparatuses, according to another embodiment of the present invention, and FIG. 2B is a cross-sectional view taken along line II-II' of FIG. 2A. In FIGS. 2A and 2B, elements corresponding to the elements described above with reference to FIGS. 1A and 1B are not repeated in describing an organic light emitting display apparatus 100 including the encapsulation film 10 of FIGS. 1A and 1B. The present embodiment may be construed with reference to the descriptions of FIGS. 1A and 1B.

The organic light emitting display apparatus 100 may include a substrate 110, an organic light emitting device 120, an adhesive layer 140, and a metal layer 130.

The substrate 110 may be formed of a transparent glass material, and when the organic light emitting display apparatus 100 is a flexible organic light emitting display apparatus, the substrate 110 may be formed of a flexible material such as plastic or the like. The substrate 110, as illustrated in FIGS. 2A and 2B, may have an area which is broader than that of the metal layer 130. An external circuit unit may be connected to an outer portion of the substrate 110, and a pad 160 for supplying various signals to the organic light emitting device 120 may be disposed at the outer portion. Light emitted from the organic light emitting device 120 may be transferred to the outside through the substrate 110.

The organic light emitting device 120 may be disposed on the substrate 110 and may include two electrodes and an organic emission layer disposed therebetween. The organic emission layer may be formed in a single emission layer structure that emits one light, or may be formed in a multi-emission layer structure that emits white light. However, the present embodiment is not limited thereto. In other embodiments, the organic emission layer may be formed in various stacked structures depending on a design of the organic light emitting device 120.

The adhesive layer 140 may be disposed on the organic light emitting device 120 and may include a first portion 140a and a second portion 140b.

The adhesive layer 140 may be formed of a photocurable resin or a thermocurable resin. When the adhesive layer 140 is formed of the photocurable resin, the adhesive layer 140 may use a material that is cured in a visible light range, for example, a wavelength range of about 380 nm to about 800 nm. The reason is because when the adhesive layer 140 disposed on the organic light emitting device 120 is cured by irradiating light, light in an infrared range damages the organic light emitting device 120. Also, when the adhesive layer 140 is formed of the thermocurable resin, the adhesive layer 140 may use a material that is cured at a temperature (for example, a temperature of about 200 degrees C. or less) that does not damage the organic light emitting device 120.

The first portion 140a of the adhesive layer 140 may seal the organic light emitting device 120. The first portion 140a may cover a step height of the substrate 110 on which the organic light emitting device 120 is disposed, and thus protects the organic light emitting device 120 from an external impact or the penetration of water or oxygen.

A degree of cure of the second portion 140b of the adhesive layer 140 may be higher than that of the first portion 140a. Also, reaction energy of the second portion 140b of the adhesive layer 140 may be higher than that of the first portion 140a. This will be described below in more detail.

Hereinafter, a process of manufacturing the organic light emitting display apparatus 100 will be described.

The metal layer 130 to which the adhesive layer 140 is adhered may be bonded to the substrate 110, on which the organic light emitting device 120 is disposed, by heat and pressure. Here, as described above with reference to FIGS. 1A and 1B, the adhesive layer 140 may include a center portion in a non-cured state and an outer portion in a cured state. Subsequently, a process of curing the adhesive layer 140 may be performed. In this case, a curing temperature may be a temperature which does not damage the organic light emitting device 120, and for example, the curing process may be performed for about three hours at about 100 degrees C. That is, in the curing process, a temperature applied to the adhesive layer 140 may be limited, and a curing time may also be limited in consideration of a process tack time.

Therefore, the first portion 140a corresponding to the center portion of the adhesive layer 140 in a non-cured state may be cured to only a degree of having characteristic for sealing the organic light emitting device 120. However, the second portion 140b corresponding to an outer portion of the adhesive layer 140 in a cured state may be almost completely cured by heat which is additionally supplied thereto in a state where the second portion 140b is cured to a certain degree. Therefore, a degree of cure of the first portion 140a may be about 90% to about 95%, and a degree of cure of the second portion 140b may be about 98% to about 100%. In other words, the degree of cure of the first portion 140a may be equal to or greater than 90% and equal to or less than 95%, and the degree of cure of the second portion 140b may be equal to or greater than 98% and equal to or less than 100%.

As described above, the second portion 140b may be in a completely cured state, where the degree of cure is 100%, depending on a method of curing the encapsulation film and a process of manufacturing the encapsulation film. Also, residual reaction energy may be changed due to a difference between the degree of cure of the first portion 140a and the degree of cure of the second portion 140b. That is, reaction energy of the first portion 140a may be measured higher than that of the second portion 140b.

The second portion 140b of the adhesive layer 140, as illustrated in FIG. 2A, may surround the first portion 140a. In this case, since the second portion 140b has been almost completely cured, water or oxygen which penetrates into the adhesive layer 140 for a process standby time in a manufacturing process is reduced. Generally, water or oxygen may penetrate through a side surface of the adhesive layer 140. However, in the present embodiment, since the degree of cure of the second portion 140b corresponding to the side surface and outer portion of the adhesive layer 140 is very high, an incidence of water or oxygen penetration is reduced, and the organic light emitting device 120 is more effectively protected.

The second portion 140b may be more opaque than the first portion 140a due to the difference between the degree of cure of the first portion 140a and the degree of cure of the second portion 140b. For example, the second portion 140b may be black.

Moreover, a width D1 of the second portion 140b may be about 1 μm to about 300 μm. When the width D1 of the second portion 140b is less than 1 μm, it is difficult to sufficiently control a flowability of the adhesive layer 140. Also, the second portion 140b may be adhered to the substrate 110 in a state of being cured to a certain degree, and an adhesive force between the second portion 140b and the substrate 110 may be lower than an adhesive force between the first portion 140a and the substrate 110. Therefore, when the width D1 of the second portion 140b is greater than 300 μm, the adhesive force between the second portion 140b and the substrate 110 may be weakened, and for this reason, water or oxygen penetrates into the organic light emitting device 120 through an interface between the adhesive layer 140 and the substrate 110. Likewise, when the second portion 140b does not overlap the organic light emitting device 120, external water or oxygen which penetrates through the interface between the adhesive layer 140 and the substrate 110 is reduced, and the organic light emitting device 120 is more effectively protected.

The metal layer 130 may have an area which is broader than that of the adhesive layer 140. That is, when seen through a cross-sectional surface, a side surface of the metal layer 130 may protrude further than the side surface of the adhesive layer 140. Therefore, the adhesive layer 140 is more effectively supported and protected. The metal layer 130 may be used as a margin area for a case where the adhesive layer 140 stretches due to pressure caused by bonding. Also, as described above, each of the adhesive layer 140 and the metal layer 130 may function as an encapsulation part of the organic light emitting display apparatus 100.

Therefore, in the organic light emitting display apparatus 100 according to another embodiment of the present invention, since the degree of cure of the second portion 140b corresponding to the outer portion of the adhesive layer 140 is higher than that of the first portion 140a corresponding to the center portion of the adhesive layer 140, the adhesive layer 140 may be controlled not to excessively stretch, and the adhesive layer 140 may cover a portion of a pad 160 which is disposed at an outer portion of the substrate 110, thereby reducing a driving defect. Also, a problem where a portion of the adhesive layer 140 clings to a jig because the adhesive layer 140 excessively stretches in a process of bonding the substrate 110 to the metal layer 130 is solved, and thus, various defects which occur when a portion of the adhesive layer 140 clings to the jig are reduced. Therefore, reliability and productivity of an organic light emitting display apparatus is enhanced.

Figure 3:
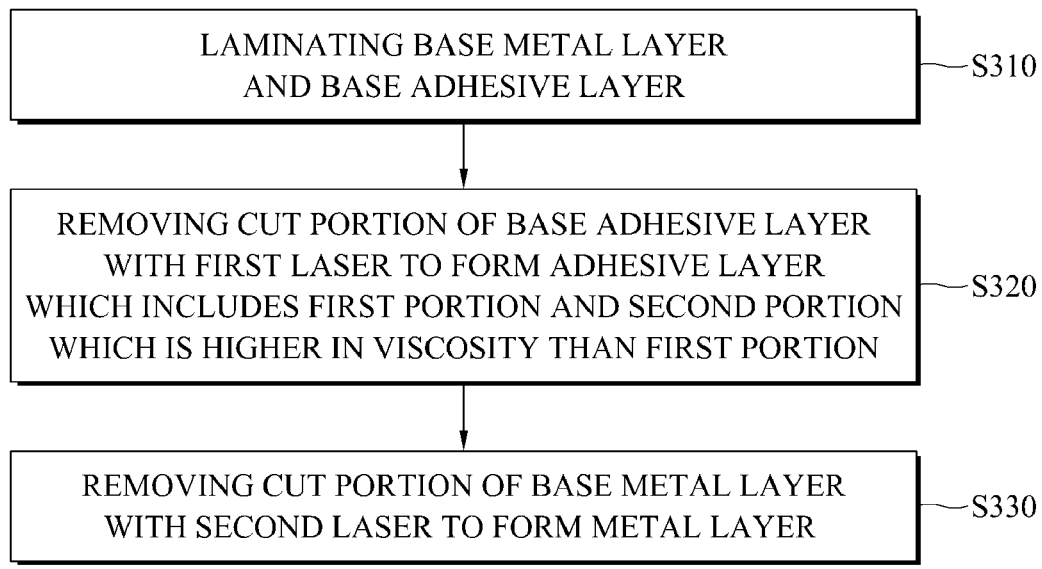
FIG. 3 is a flowchart for describing a method of manufacturing an encapsulation film for organic light emitting display apparatuses, according to an embodiment of the present invention.

FIG. 3 is a flowchart describing a method of manufacturing an encapsulation film 10 for organic light emitting display apparatuses, according to an embodiment of the present invention. FIGS. 4 to 7 are cross-sectional views and perspective views describing a method of manufacturing the encapsulation film 10 for organic light emitting display apparatuses, according to an embodiment of the present invention. In describing the present embodiment, detailed descriptions of elements which are the same as or correspond to the preceding embodiment are not provided.

Figure 4:
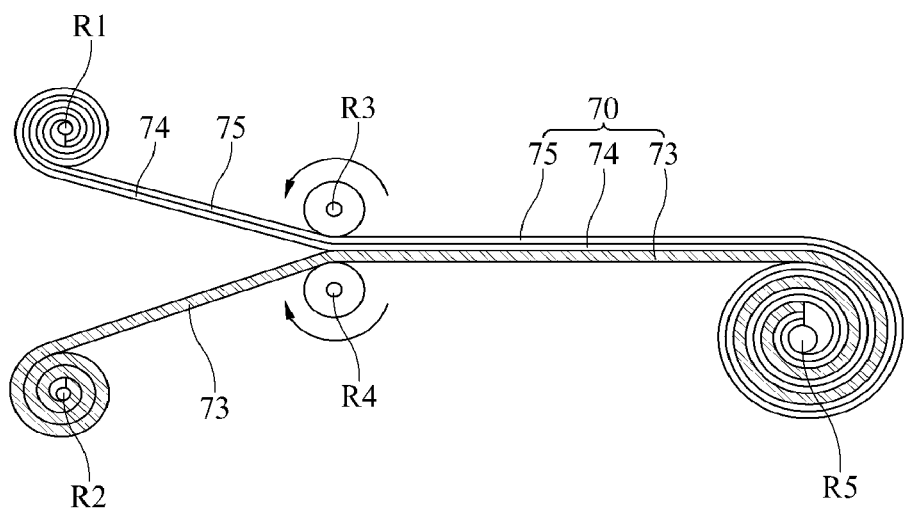
FIGS. 4 to 7 are cross-sectional views and perspective views describing a method of manufacturing an encapsulation film for organic light emitting display apparatuses according to an embodiment of the present invention.

First, a base metal layer 73 and a base adhesive layer 74 may be laminated in operation S310. Referring to FIG. 4, the base metal layer 73 rolled up around a second roller R2 and the base adhesive layer 74 and a base protective layer 75 rolled up around a first roller R1 may be laminated by a third roller R3 and a fourth roller R4 in order for the base metal layer 73 to face the base adhesive layer 74. The laminated base metal layer 73, base adhesive layer 74, and base protective layer 75 may configure a base encapsulation film 70, which may be rolled up around a fifth roller R5. Such a method may be referred to as a roll-to-roll method. In the present embodiment, a process of manufacturing the encapsulation film 70 may be performed through the roll-to-roll method where a layer is unrolled from one roller and is rolled up around another roller, and thus, a process tact time and productivity are enhanced.

Subsequently, in operation S320, an adhesive layer may be formed by removing a cut portion C1 of the base adhesive layer 74 with a first laser L1. Here, the adhesive layer may include a first portion and a second portion which is higher in viscosity than the first portion.

Figure 5A:
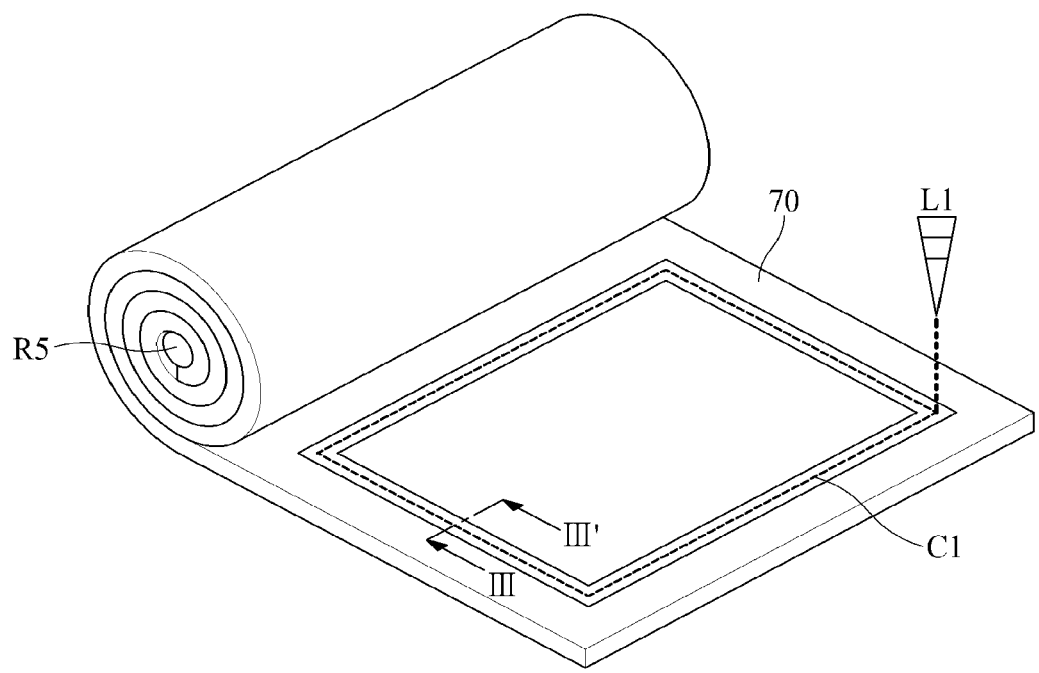

Referring to FIG. 5A, the first laser L1 may be irradiated onto the base protective layer 75 of the base encapsulation film 70 rolled up around the fifth roller R5. When the first laser L1 is irradiated to correspond to the cut portion C1 of the base adhesive layer 74, the cut portion C1 of the base adhesive layer 74 and a portion of the base protective layer 75 corresponding to the cut portion C1 of the base adhesive layer 74 may be removed together. The cut portion C1 of the base adhesive layer 74 may determine a shape of the encapsulation film 10 which is finally manufactured. In FIG. 5A, the cut portion C1 of the base adhesive layer 74 is illustrated in a tetragonal shape, but is not limited thereto. In other embodiments, the cut portion C1 of the base adhesive layer 74 may have various sizes and shapes.

Figure 5B:
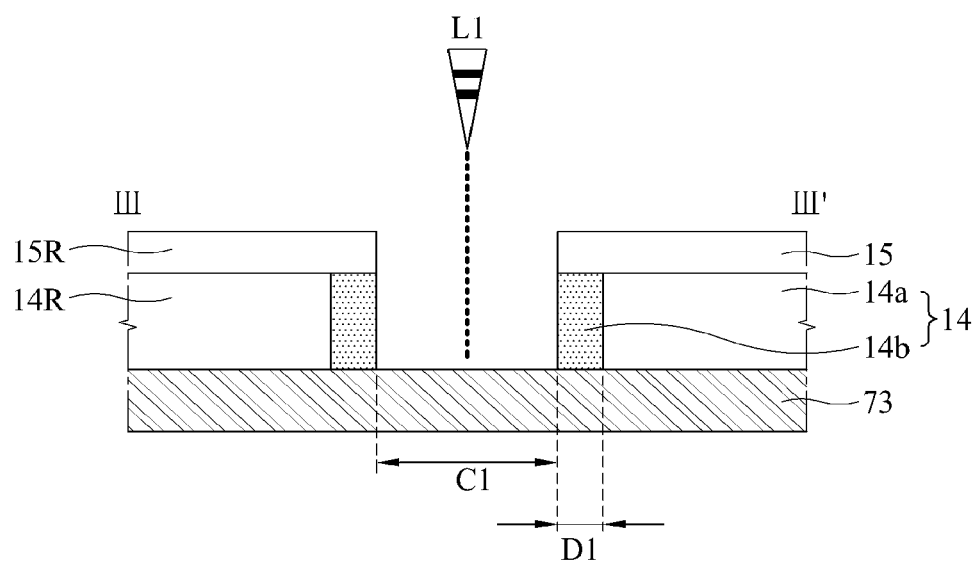

FIG. 5B illustrates a cross-sectional view taken along line III-III' of FIG. 5A. Referring to FIG. 5B, the cut portion C1 of the base adhesive layer 74 and a portion of the base protective layer 75 may be removed by the first laser L1, and simultaneously, a side surface contacting the cut portion C1 of the base adhesive layer 74 may be cured by the first laser L1. That is, the base adhesive layer 74 may be separated into an adhesive layer 14 and a remaining adhesive layer 14R by the first laser L1, and the base protective layer 75 may be separated into a protective layer 15 and a remaining protective layer 15R by the first laser L1. In this case, a side surface of the adhesive layer 14 and a side surface of the remaining adhesive layer 14R which correspond to the cut portion C1 may be cured. Therefore, the adhesive layer 14 may be divided into a first portion 14a in a non-cured state and a second portion 14b in a cured state. Accordingly, a viscosity of the second portion 14b of the adhesive layer 14 may be higher than that of the first portion 14a.

The second portion 14b of the adhesive layer 14 may be formed on all side surfaces and outer portions of the adhesive layer corresponding to the cut portion C1 of the base adhesive layer 74 and thus may surround the first portion 14a.

The first laser L1 may remove the base adhesive layer 74 and the base protective layer 75 which are each formed of a resin, and may be a gas laser. The gas laser may use a gas as an illuminator of a laser, and for example, may use a He—Ne gas, a $CO_2$ gas, or the like.

A width D1 of the second portion 14b of the adhesive layer 14 may be about 1 μm to about 300 μm and may be adjusted by an intensity of the first laser L1. The intensity of the first laser L1 may be adjusted by using an irradiation time, the amount of supplied gas, an irradiation speed, a voltage, and/or the like.

Moreover, the second portion 14b of the adhesive layer 14 may be completely cured by the first laser L1. When an irradiation intensity of the first laser L1 is adjusted in removing the cut portion C1 of the base adhesive layer 74, a temperature of a cut side surface may instantaneously rise to a maximum of 1,500 degrees C., and thus, the second portion 14b may be completely cured. The second portion 14b of the adhesive layer 14 may have the form of soot which has black due to a high temperature.

Subsequently, in operation S330, the metal layer 13 may be formed by removing a cut portion C2 of the base metal layer 73 with a second layer L2.

Figure 6A:
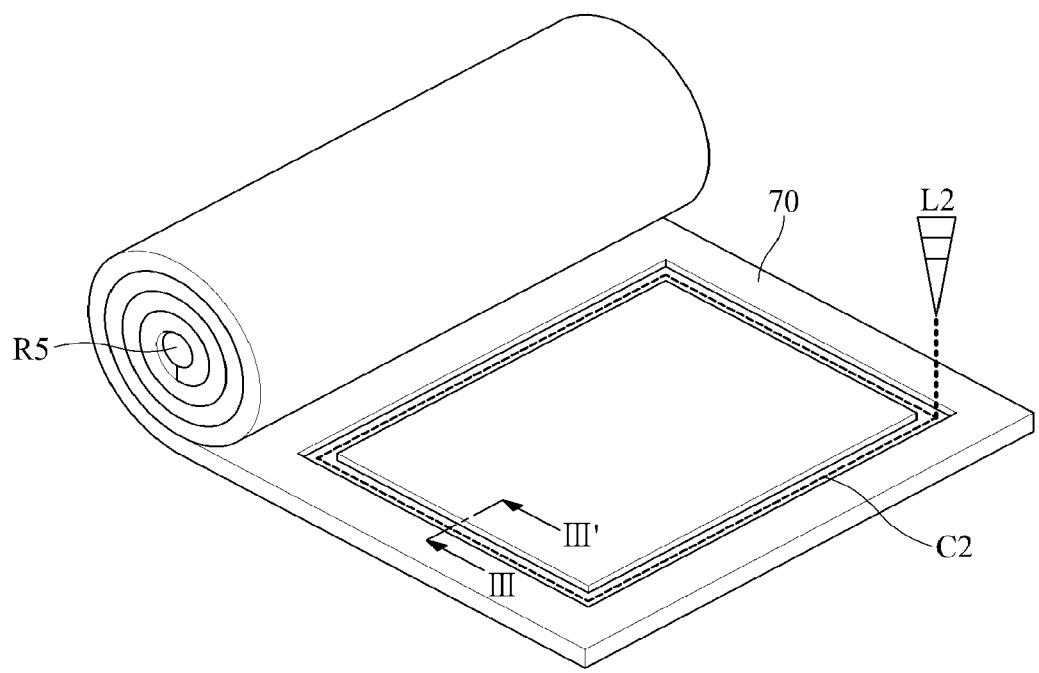

Referring to FIG. 6A, in the base encapsulation film 70, the second laser L2 may be irradiated to correspond to the cut portion C2 of the base metal layer 73. An irradiation area of the second laser L2 may correspond to an irradiation area of the first laser L1, and the cut portion C2 of the base metal layer 73 may be removed by the second laser L2.

The second laser L2 may remove a metal material, and for example, may be an optical fiber laser or the like.

Figure 6B:
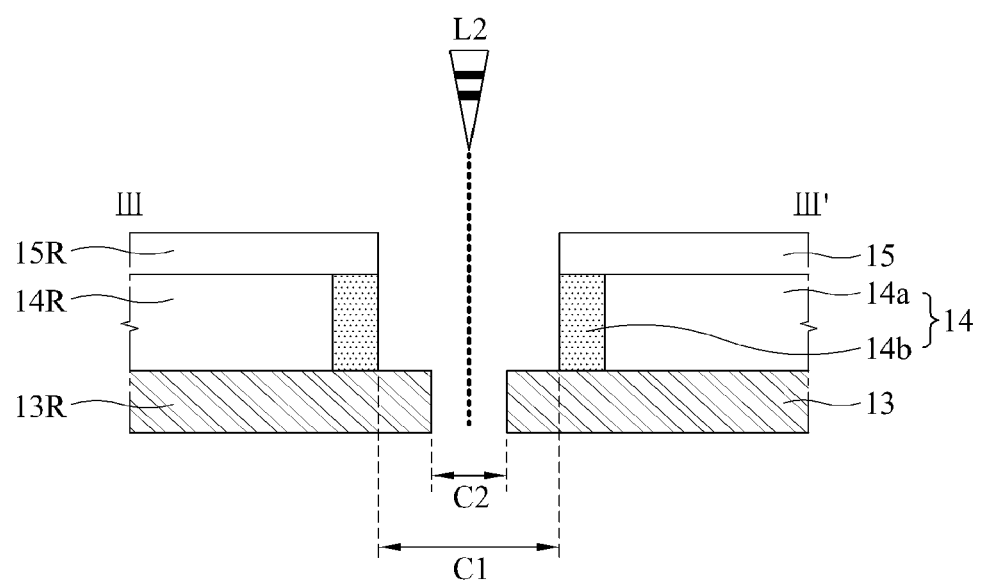
Figure 7:
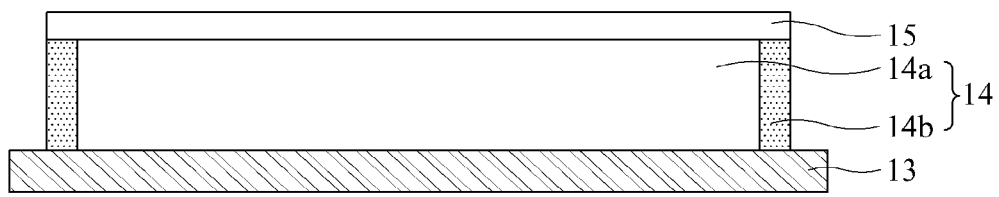

FIG. 6B illustrates a cross-sectional view taken along line III-III' of FIG. 6A. Referring to FIG. 6B, the base metal layer 73 may be separated into a metal layer 13 and a remaining metal layer 13R by the second laser L2. Therefore, as illustrated in FIG. 7, an encapsulation film 10 including the metal layer 13, the adhesive layer 14, and the protective layer 15 may be finished. In this case, as illustrated in FIG. 7, a width of the cut portion C2 of the base metal layer 73 may be formed more narrow than that of the cut portion C1 of the base adhesive layer 74, and thus, an area of the metal layer 13 of the encapsulation film 10 may be formed broader than that of the adhesive layer 14.

As described above, the first laser L1 may be determined based on a material characteristic of the base adhesive layer 74, and the second laser L2 may be determined based on a material characteristic of the base metal layer 73. The first laser L1 may determine a width of the cut portion C1 of the base adhesive layer 74, and the second laser L2 may determine a width of the cut portion C2 of the base metal layer 73. That is, it is difficult for cut portions of different layers to have different widths in a one-time laser process. Therefore, when a laser process is performed at least twice, a side surface of the metal layer 13 may be more stably formed to protrude further than a side surface of the adhesive layer 14.

Therefore, in the method of manufacturing the encapsulation film 10 for organic light emitting display apparatuses according to an embodiment of the present invention, since the second portion 14b of the adhesive layer 14 is formed in a process of removing the cut portion of the base adhesive layer 74, a manufacturing process is simplified, and a process tack time is easily shortened, thereby enhancing productivity of the encapsulation film 10. Also, in the manufacturing method according to an embodiment of the present invention, the metal layer and the adhesive layer that each function as the encapsulation part of the organic light emitting display apparatus may be manufactured as an integrated encapsulation film.

Therefore, in a process of manufacturing the organic light emitting display apparatus, the encapsulation film 10 which includes the adhesive layer 14 and the metal layer 13 may be adhered to the organic light emitting device at a time or simultaneously without forming the adhesive layer 14 and the metal layer 13. Thus, the process of manufacturing the organic light emitting display apparatus is simplified, and the cost of materials is reduced. In addition, the second portion 14b may be completely cured by adjusting an intensity of the first laser L1, and thus, the encapsulation film 10 reduces water or oxygen which penetrates into the adhesive layer 14 in the process of manufacturing the organic light emitting display apparatus, and prevents the water blocking function of the adhesive layer 14 from being deteriorated.

The encapsulation film 10 manufactured by the manufacturing method according to an embodiment of the present invention may be referred to as a structure which includes a first film having metal properties and a second film having adhesive properties. In more detail, the metal layer 13 of the encapsulation film 10 may be the first film having metal properties, and the adhesive layer 14 may be the second film having adhesive properties. The structure which includes the first film and the second film may be configured as an integrated type to function as the encapsulation part for organic light emitting display apparatuses.

Referring to FIG. 7, the first film may be adhered to one surface of the second film, and the second film may include an area 14a having relatively low viscosity and an area 14b which has relatively high viscosity and surrounds an outer portion of the area 14a having relatively low viscosity. The second film may be implemented in order for roll-to-roll processing to be performed, and the area 14b where the viscosity of the second film is relatively high may be formed through heat or light curing in performing a laser cutting process on the structure.

In the second film, a dimension of the area 14b having relatively high viscosity may be designed based on at least one of a condition of the laser cutting process, a condition for functioning as the encapsulation part for organic light emitting display apparatuses, and a characteristic condition of the second film.

In detail, the area 14b having relatively high viscosity may have a dimension which enables flowability to be controlled in order for the structure to function as the encapsulation part for organic light emitting display apparatuses, a dimension where an adhesive characteristic of the structure is not considerably reduced, or a dimension for minimizing a penetration characteristic of external water or oxygen. Also, the area 14b having relatively high viscosity may have a dimension based on the condition of the laser cutting process, for example, a laser irradiation time, the amount of supplied gas, an irradiation speed, a voltage, and/or the like. Also, the area 14b having relatively high viscosity may have a dimension based on a characteristic of the second film, for example, a material of the second film.

A side surface of the first film may protrude further than the side surface of the second film so as to effectively support and protect the second film and provide a margin area where the second film stretches due to heat or pressure in a bonding process of the second film.

In FIGS. 4 to 7, a method of manufacturing the encapsulation film 10 with the two lasers L1 and L2 and a method of completely curing a portion of the adhesive layer 14 with a laser have been described, but another curing method may be used based on a process environment and a process condition. For example, a metal bar having high heat conductivity may be disposed to correspond to a size of the second portion 14b of the adhesive layer 14, and the second portion 14b may be cured by applying heat to the metal bar. The curing method is difficult to adjust an accurate width of the second portion 14b, but is easy to adjust the degree of cure of the second portion 14b. Therefore, the curing method may be applied to a case of desiring to accurately adjust the degree of cure of the second portion 14b to a desired value.

In the structure according to an embodiment of the present invention, an area having relatively high viscosity may be formed through heat or light curing in the laser cutting process.

In the structure according to an embodiment of the present invention, a side surface of a first film may be configured to protrude further than a side surface of a second film, and thus, the second film is effectively supported and protected, and a margin area for a case where the second film stretches due to heat or pressure in a bonding process of the second film may be provided.

In the structure according to an embodiment of the present invention, a dimension of an area having relatively high viscosity may be designed based on at least one of a condition of a laser cutting process, a characteristic for functioning as an encapsulation part for organic light emitting display apparatuses, and a characteristic of the second film.

In an encapsulation film for organic light emitting display apparatuses according to an embodiment of the present invention, an adhesive layer may include a first area and a second area which is higher in viscosity than the first area, and the second area of the adhesive layer may surround the first area of the adhesive layer.

In the encapsulation film for organic light emitting display apparatuses according to an embodiment of the present invention, a degree of cure of the second area of the adhesive layer may be higher than a degree of cure of the first area.

In the encapsulation film for organic light emitting display apparatuses according to an embodiment of the present invention, reaction energy of the first area of the adhesive layer may be higher than reaction energy of the second area of the adhesive layer.

In the encapsulation film for organic light emitting display apparatuses according to an embodiment of the present invention, a degree of cure of the second area of the adhesive layer may be 95% to 100%.

In the encapsulation film for organic light emitting display apparatuses according to an embodiment of the present invention, an area of a metal layer may be broader than an area of an adhesive layer.

In an organic light emitting display apparatus according to another embodiment of the present invention, reaction energy of a first portion of an adhesive layer may be higher than reaction energy of a second portion of the adhesive layer.

In the organic light emitting display apparatus according to another embodiment of the present invention, a degree of cure of the second portion of the adhesive layer may be 98% to 100%.

In the organic light emitting display apparatus according to another embodiment of the present invention, the second portion of the adhesive layer may be more opaque than the first portion of the adhesive layer.

In the organic light emitting display apparatus according to another embodiment of the present invention, the second portion of the adhesive layer may not overlap an organic light emitting device.

In the organic light emitting display apparatus according to another embodiment of the present invention, a width of the second portion of the adhesive layer may be 1 µm to 300 µm.

In the organic light emitting display apparatus according to another embodiment of the present invention, a side surface of a metal layer may protrude further than a side surface of the adhesive layer.

In the organic light emitting display apparatus according to another embodiment of the present invention, the metal layer and the adhesive layer may be simultaneously adhered to the organic light emitting device.

In a method of manufacturing an encapsulation film for organic light emitting display apparatuses according to an embodiment of the present invention, a second portion may be formed to surround a first portion.

In the method of manufacturing an encapsulation film for organic light emitting display apparatuses according to an embodiment of the present invention, an irradiation area of a second laser may correspond to an irradiation area of a first laser.

In the method of manufacturing an encapsulation film for organic light emitting display apparatuses according to an embodiment of the present invention, the first laser may use a gas laser, and the second laser may use an optical fiber laser.

In the method of manufacturing an encapsulation film for organic light emitting display apparatuses according to an embodiment of the present invention, a width of a cut portion of a base metal layer may be narrower than a width of a cut portion of a base adhesive layer.

In the method of manufacturing an encapsulation film for organic light emitting display apparatuses according to an embodiment of the present invention, an area of a metal layer may be broader than an area of an adhesive layer.

As described above, according to the embodiments of the present invention, since degrees of cure of an outer portion and a center portion of the adhesive layer are differently set, a driving defect is prevented from occurring in a process of manufacturing the organic light emitting display apparatus, and various defects are prevented from being caused by the jig, thereby enhancing reliability and productivity of the organic light emitting display apparatus.

Moreover, according to the embodiments of the present invention, a water blocking function of the adhesive layer is prevented from being deteriorated due to water or oxygen which penetrates into the adhesive layer for a process standby time.

Moreover, according to the embodiments of the present invention, a process of removing a portion of the adhesive layer and a process of increasing a viscosity of a portion of the adhesive layer are simultaneously performed, thereby simplifying a manufacturing process and enhancing productivity.

The details of the present invention described in technical problem, technical solution, and advantageous effects do not specify essential features of claims, and thus, the scope of claims is not limited by the details described in detailed description of the invention.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. A method of manufacturing an organic light emitting display device including an encapsulation film, the method comprising:
   forming an organic light emitting device on a substrate; and
   forming the encapsulation film on the organic light emitting device,
   wherein forming the encapsulation film comprises:
      laminating a base adhesive layer on a base metal layer;
      forming an adhesive layer including a first portion, and a second portion that is higher in viscosity than the first portion by removing a cut portion of the base adhesive layer with a first laser, wherein the second portion is formed through heat or light curing when removing the cut portion of the base adhesive layer with the first laser; and
      forming a metal layer by removing a cut portion of the base metal layer with a second laser,
      wherein a width of the cut portion of the base metal layer is more narrow than a width of the cut portion of the base adhesive layer.

2. The method of claim 1, wherein the second portion is formed simultaneously with removing the cut portion of the base adhesive layer.

3. The method of claim 1, wherein the second portion surrounds the first portion.

4. The method of claim 1, wherein an irradiation area of the second laser corresponds to an irradiation area of the first laser.

5. The method of claim 1, wherein the first laser uses a gas laser, and the second laser uses an optical fiber laser.

6. The method of claim 1, wherein a degree of cure of the second portion is higher than a degree of cure of the first portion.

7. The method of claim 6, wherein the degree of cure of the second portion is 95% to 100%,
wherein the degree of cure (D) is defined as the following Equation (1), $$D[\%] = \frac{H1 - H2}{H1} \times 100, \quad \text{Equation (1)}$$

wherein H1 denotes heat that is generated while a sample in a non-cured state is completely cured, and H2 denotes heat that is generated while a sample to be measured is completely cured.

8. The method of claim 1, further comprising:
forming an organic light emitting device on a substrate,
wherein the second portion of the adhesive layer does not overlap the organic light emitting device.

9. A method of manufacturing an organic light emitting display device including an encapsulation film, the method comprising:
forming an organic light emitting device on a substrate; and
forming the encapsulation film on the organic light emitting device,
wherein forming the encapsulation film comprises:
laminating a base adhesive layer on a base metal layer;
forming an adhesive layer including a first portion, and a second portion that is higher in viscosity than the first portion by removing a cut portion of the base adhesive layer with a first laser, wherein the second portion is formed through heat or light curing when removing the cut portion of the base adhesive layer with the first laser; and
forming a metal layer by removing a cut portion of the base metal layer with a second laser,
wherein a side surface of the metal layer is configured to protrude further than a side surface of the adhesive layer so that the adhesive layer is effectively supported and protected, and a margin area.

10. A method of manufacturing an organic light emitting display device, the method comprising:
forming an organic light emitting device on a substrate; and
forming an encapsulation film on the organic light emitting device,
wherein forming the encapsulation film comprises:
laminating a base adhesive layer on a base metal layer,
forming an adhesive layer including a first portion, and a second portion that is higher in viscosity than the first portion by removing a cut portion of the base adhesive layer with a first laser, wherein the second portion is formed through heat or light curing when removing the cut portion of the base adhesive layer with the first laser; and
forming a metal layer by removing a cut portion of the base metal layer with a second laser,
wherein a width of the cut portion of the base metal layer is more narrow than a width of the cut portion of the base adhesive layer.

11. The method of claim 10, wherein a side surface of the metal layer is configured to protrude further than a side surface of the adhesive layer so that the adhesive layer is effectively supported and protected, and a margin area.

12. The method of claim 10, wherein the second portion is formed simultaneously with removing the cut portion of the base adhesive layer.

13. The method of claim 10, wherein the second portion surrounds the first portion.

14. The method of claim 10, wherein an irradiation area of the second laser corresponds to an irradiation area of the first laser.

15. The method of claim 10, wherein the first laser uses a gas laser, and the second laser uses an optical fiber laser.

16. The method of claim 10, wherein a degree of cure of the second portion is higher than a degree of cure of the first portion.

17. The method of claim 16, wherein the degree of cure of the second portion is 95% to 100%,
wherein the degree of cure (D) is defined as the following Equation (1), $$D[\%] = \frac{H1 - H2}{H1} \times 100, \quad \text{Equation (1)}$$

wherein H1 denotes heat that is generated while a sample in a non-cured state is completely cured, and H2 denotes heat that is generated while a sample to be measured is completely cured.

* * * * *